United States Patent
Jeon et al.

(10) Patent No.: US 7,655,979 B2
(45) Date of Patent: *Feb. 2, 2010

(54) HIGH VOLTAGE GATE DRIVER INTEGRATED CIRCUIT INCLUDING HIGH VOLTAGE JUNCTION CAPACITOR AND HIGH VOLTAGE LDMOS TRANSISTOR

(75) Inventors: Chang-Ki Jeon, Gimpso-si (KR); Sung-Iyong Kim, Bucheon-si (KR); Tae-hun Kwon, Yangcheon-gu (KR)

(73) Assignee: Fairchild Korea Semiconductor, Ltd., Bucheon (KR)

(*) Notice: Subject to any disclaimer, the term of this patent is extended or adjusted under 35 U.S.C. 154(b) by 0 days.

This patent is subject to a terminal disclaimer.

(21) Appl. No.: 11/950,959

(22) Filed: Dec. 5, 2007

(65) Prior Publication Data
US 2008/0074165 A1    Mar. 27, 2008

Related U.S. Application Data

(62) Division of application No. 11/114,693, filed on Apr. 26, 2005, now Pat. No. 7,309,894.

(30) Foreign Application Priority Data
Apr. 27, 2004    (KR) ............ 10-2004-0029182

(51) Int. Cl.
 H01L 29/772   (2006.01)
 H01L 21/265   (2006.01)
(52) U.S. Cl. ............ 257/335; 257/328; 257/E27.11; 257/E29.027
(58) Field of Classification Search ............ 438/637, 438/638; 257/E21.579, 328, 335, E27.11, 257/E29.027
See application file for complete search history.

(56) References Cited

U.S. PATENT DOCUMENTS 7,309,894 B2 * 12/2007 Jeon et al. .......... 257/328
2002/0005550 A1 * 1/2002 Takahashi et al. ...... 257/335

* cited by examiner

*Primary Examiner*—Michelle Estrada
(74) *Attorney, Agent, or Firm*—Thomas R. FitzGerald, Esq.; Hiscock & Barclay, LLP

(57) ABSTRACT

There is provided a high voltage gate driver integrated circuit. The high voltage gate driver integrated circuit includes: a high voltage region; a junction termination region surrounding the high voltage region; a low voltage region surrounding the junction termination region; a level shift transistor disposed between the high voltage region and the low voltage region, at least some portions of the level shift transistor being overlapped with the junction termination region; and/or a high voltage junction capacitor disposed between the high voltage region and the low voltage region, at least some portions of the high voltage junction capacitor being overlapped with the junction termination region.

6 Claims, 5 Drawing Sheets

HIGH VOLTAGE GATE DRIVER INTEGRATED CIRCUIT INCLUDING HIGH VOLTAGE JUNCTION CAPACITOR AND HIGH VOLTAGE LDMOS TRANSISTOR

CROSS REFERENCE TO RELATED APPLICATIONS

This application is a divisional of U.S. patent application Ser. No. 11/114,693 filed Apr. 26, 2005 which claims priority to Korean Patent Application No. 10-2004-0029 182 filed Apr. 27, 2004.

BACKGROUND OF THE INVENTION

1. Field of the Invention

The present invention relates to a high voltage gate driver integrated circuit, and more particularly, to a high voltage gate driver integrated circuit including a high voltage junction capacitor and a high voltage LDMOS transistor.

2. Description of Related Art

FIG. 1 is a layout view showing a conventional high voltage gate driver integrated circuit.

In general, the conventional high voltage gate driver integrated circuit 100 comprises a low voltage region 110 and a high voltage region 120 surrounded by the low voltage region 110. A junction termination region 131 is disposed between the low and high voltage regions 110 and 120. An n type lateral double-diffused MOS (LDMOS) transistor 132 is disposed in the low voltage region 110. A p type high voltage MOS transistor 133 is disposed in the high voltage region 120. The signal transmission from the low voltage region 110 to the high voltage region 120 is made by the junction termination region 131 and the n type LDMOS transistor 132. On the contrary, the signal transmission from the high voltage region 120 to the low voltage region 110 is made by the junction termination region 131 and the p type MOS transistor 133. The n type LDMOS transistor 132 and the p type MOS transistor 133 are elements for shifting a level from high to low voltage, and vice versa.

The junction termination region 131 provides an electrical isolation between the low voltage region 110 and the high voltage region 120. The junction termination region 131 must have enough width to ensure high reliability of the high voltage gate driver integrated circuit 100. In particular, the junction termination region 131 must have a relatively large width in order to ensure a breakdown voltage of about 600V or more and prevent malfunction of the high voltage gate driver integrated circuit 100 due to a punch-through effect resulting from formation of a depletion region. The n type LDMOS transistor 132 and the p type MOS transistor 133 are disposed in the low voltage region 110 and the high voltage region 120, respectively, and the junction termination region 131 having a relatively large width is disposed between the low voltage region 110 and the high voltage region 120. Therefore, the conventional high voltage gate driver integrated circuit 100 has a problem in that its size is relatively large. In addition, in a case where a high voltage junction capacitor is needed, the high voltage junction capacitor, as an additional element, is electrically connected to the conventional high voltage gate driver integrated circuit 100 by means of wiring lines.

SUMMARY OF THE INVENTION

The present invention provides a high voltage gate driver integrated circuit with a greater degree of integration by forming a high voltage junction capacitor and a high voltage LDMOS transistor at least a portion of a junction termination region.

According to a first aspect of the present invention, there is provided a high voltage gate driver integrated circuit including: a high voltage region; a junction termination region surrounding the high voltage region; a low voltage region surrounding the junction termination region; and a level shift transistor disposed between the high voltage region and the low voltage region, at least some portions of the level shift transistor being overlapped with the junction termination region.

According to a second aspect of the present invention, there is provided a high voltage gate driver integrated circuit including: a high voltage region; a junction termination region surrounding the high voltage region; a low voltage region surrounding the junction termination region; and a high voltage junction capacitor disposed between the high voltage region and the low voltage region, at least some portions of the high voltage junction capacitor being overlapped with the junction termination region.

According to a third aspect of the present invention, there is provided a high voltage gate driver integrated circuit including: a high voltage region; a junction termination region surrounding the high voltage region; a low voltage region surrounding the junction termination region; a level shift transistor disposed between the high voltage region and the low voltage region, at least some portions of the level shift transistor being overlapped with the junction termination region; and a high voltage junction capacitor disposed between the high voltage region and the low voltage region, at least some portions of the high voltage junction capacitor being overlapped with the junction termination region.

In the first or third aspect of the present invention, the level shift transistor is an LDMOS transistor.

The LDMOS transistor includes: a second conductive type epitaxial layer formed on a first conductive type substrate; a first conductive type well region formed over the epitaxial layer; a second conductive type highly doped source region formed over the well region; a second conductive type highly doped drain region formed over the epitaxial layer to be separated in a certain distance in a lateral direction from the well region; a gate electrode formed on a channel formation region over the well region through a gate insulating layer; a source electrode electrically connected to the highly doped source region; and a drain electrode electrically connected to the highly doped drain region.

The junction termination region includes: a first region separated in a certain distance from the high voltage region, the first region surrounding the high voltage region; and a second region disposed between the first region and the high voltage region.

The first region includes an insulating region electrically isolating the LDMOS transistor from the low voltage region, and wherein the insulating region is contacted to a lower portion of the well region and extends in a vertical direction to the substrate.

The high voltage gate driver integrated circuit further includes a first conductive type highly doped contact region formed over the well region is contacted to the source electrode.

In the second or third aspect of the present invention, the high voltage junction capacitor includes: a first conductive type well region formed over the epitaxial layer; a first conductive type highly doped contact region formed over the well region; a second conductive type highly doped drain region formed over the epitaxial layer separated by a certain distance in a lateral direction from the well region; a gate electrode formed on a channel formation region over the well region through a gate insulating layer; a source electrode electrically connected to the highly doped contact region, the source electrode constituting a short circuit with the gate electrode; and a drain electrode electrically connected to the highly doped drain region.

The junction termination region includes: a first region separated in a certain distance from the high voltage region, the first region surrounding the high voltage region; and a second region disposed between the first region and the high voltage region.

The first region may comprise an insulating region electrically isolating the LDMOS transistor from the low voltage region, and wherein the insulating region is contacted to a lower portion of the well region and extends in a vertical direction to the substrate.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
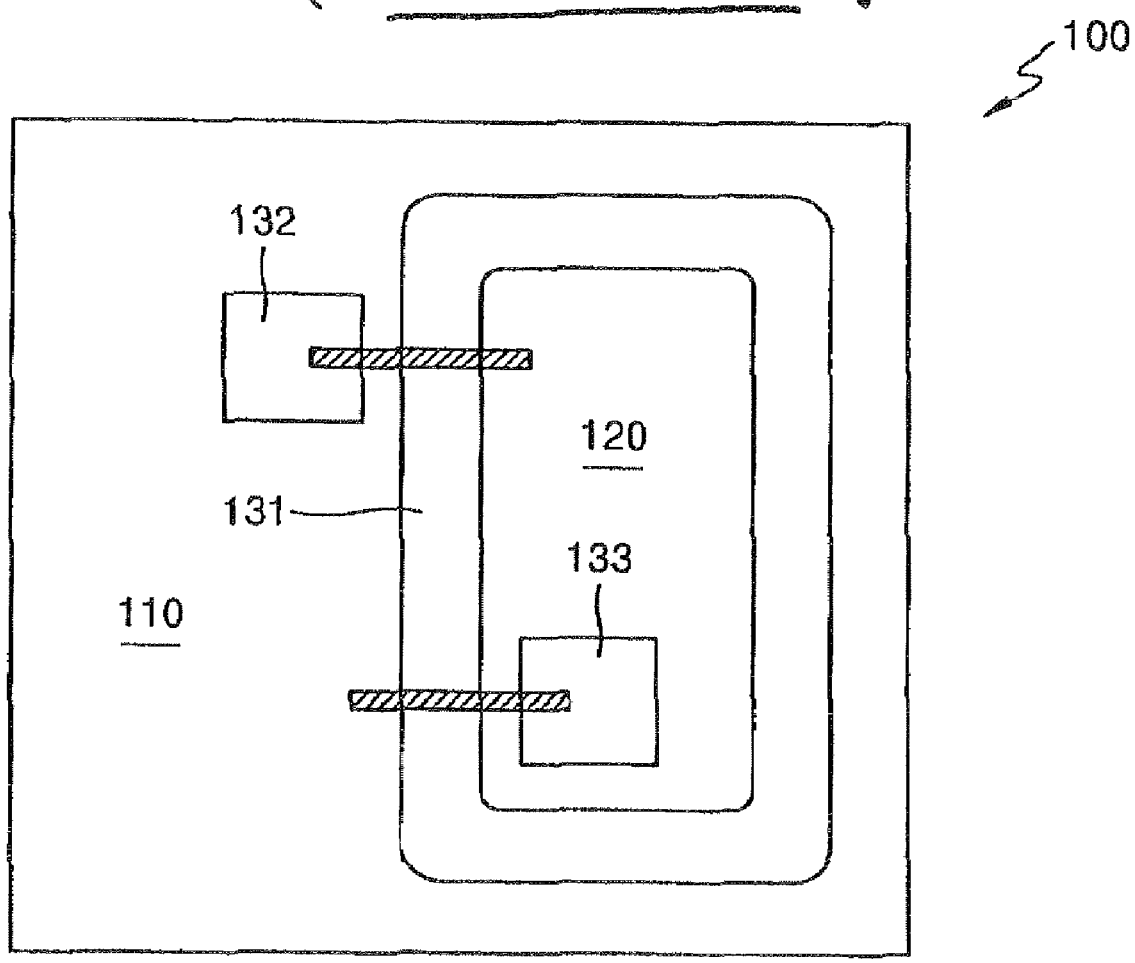
FIG. 1 is a layout view showing a conventional high voltage gate driver integrated circuit.

The present invention and operational advantages thereof can be fully understood by referring to the accompanying drawings and explanations thereof.

Now, exemplary embodiments of the present invention will be described with reference to the accompanying drawings to explain the present invention in detail. In the drawings, the same reference numerals indicate the same elements.

Figure 2:
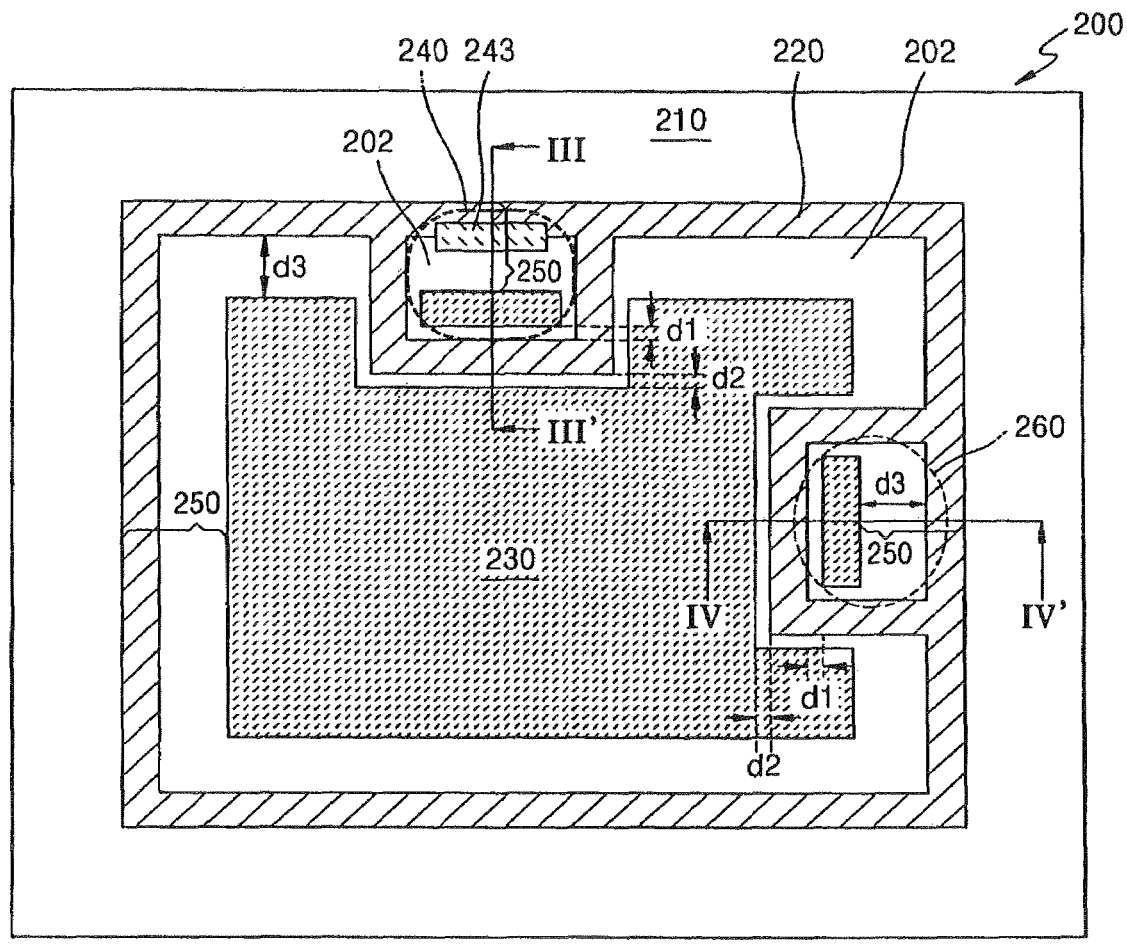
FIG. 2 is a layout view showing one embodiment of a high voltage gate driver integrated circuit according to the present invention.
Figure 3:
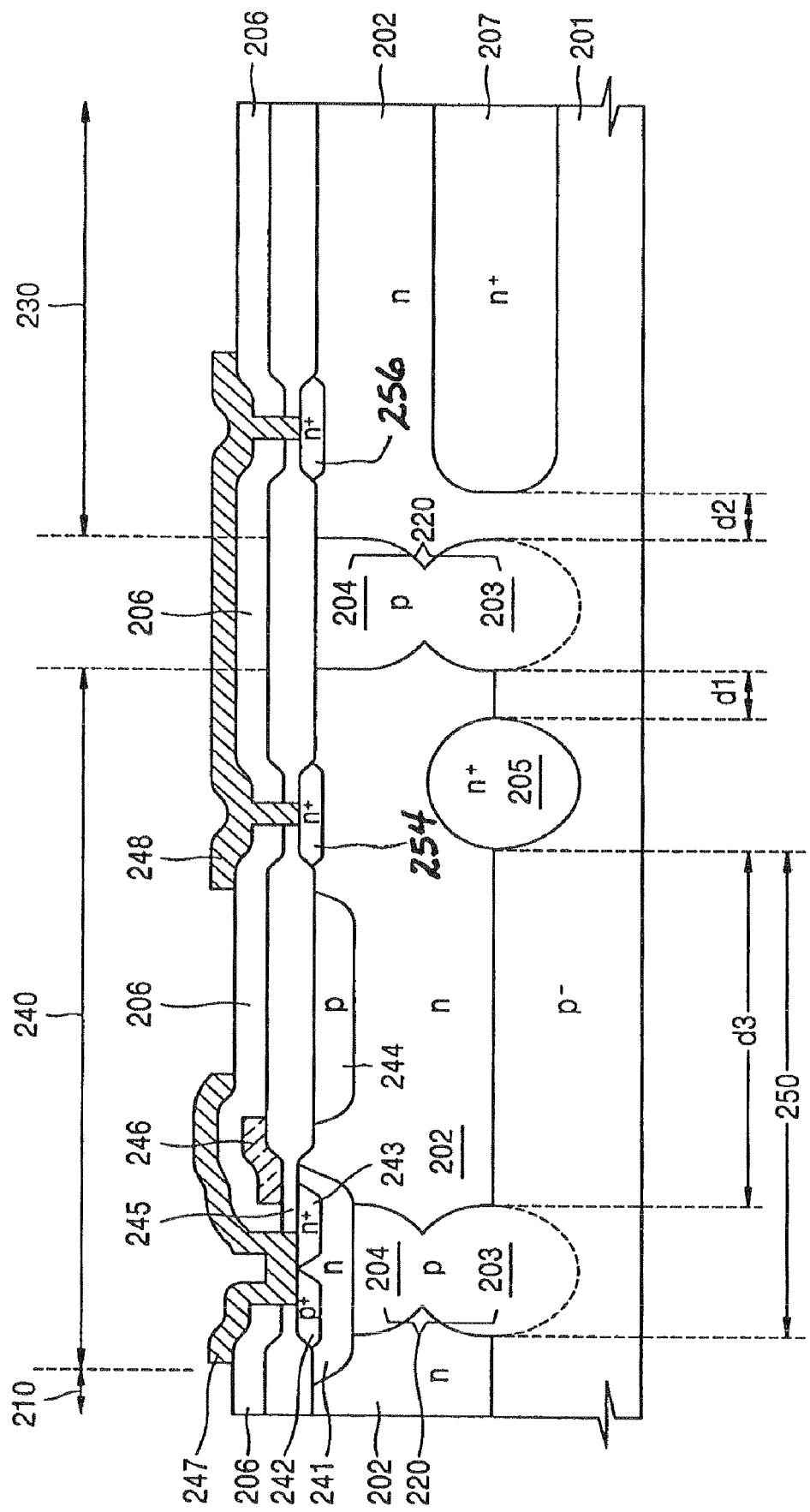
FIG. 3 is a cross sectional view taken along a line III-III' of FIG. 2.
Figure 4:
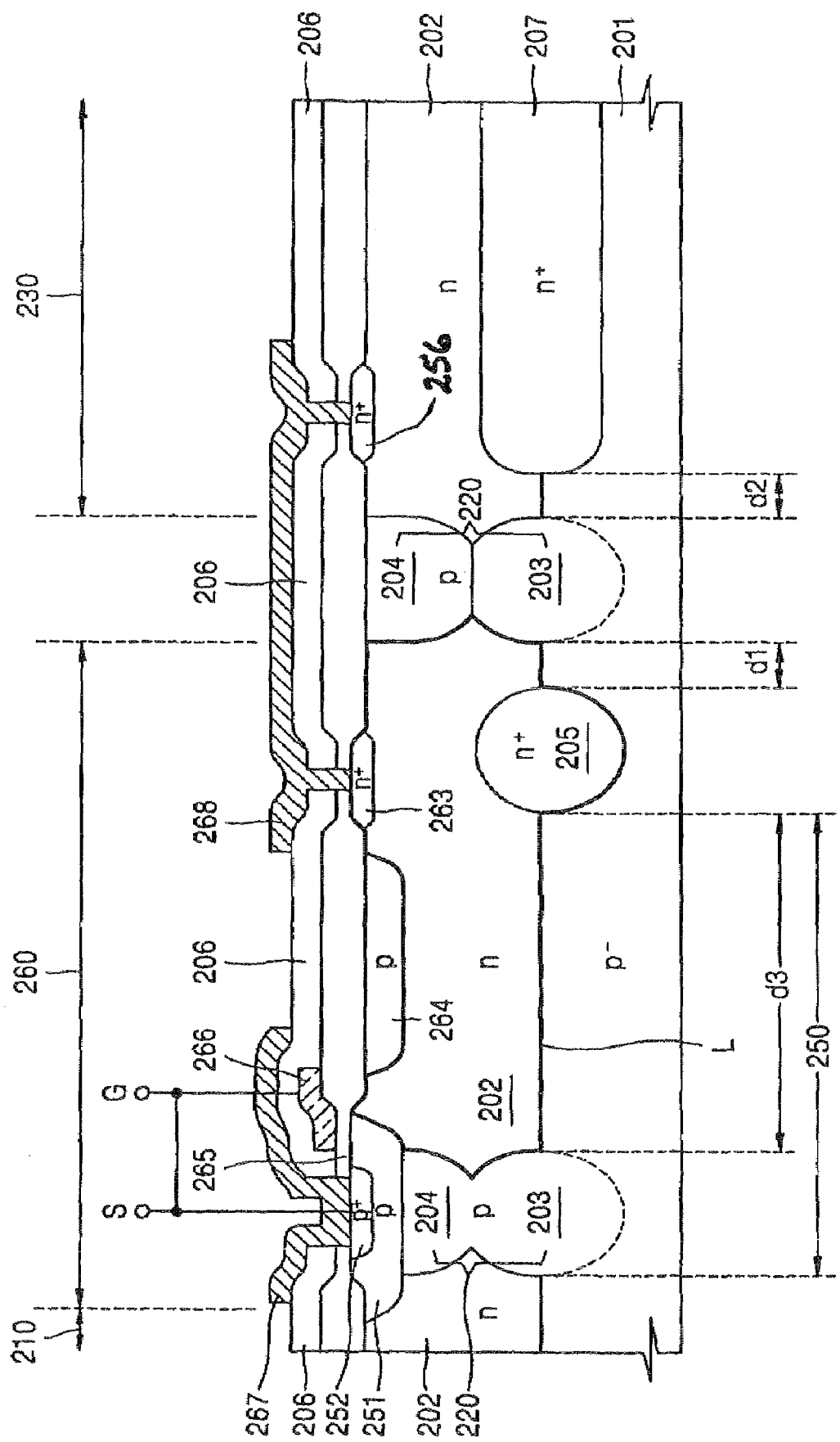
FIG. 4 is a cross sectional view taken along a line IV-IV' of FIG. 2.

FIG. 2 is a layout view showing one embodiment of a high voltage gate driver integrated circuit according to the present invention. FIG. 3 is a cross sectional view taken along a line III-III' of FIG. 2. FIG. 4 is a cross sectional view taken along a line IV-IV' of FIG. 2. The same components are indicated with the same reference numerals in FIGS. 2 to 4.

Referring to FIG. 2, a high voltage gate driver integrated circuit 200 according to an embodiment of the present invention includes a low voltage region 210, a junction termination region 250, and a high voltage region 230. The high voltage region 230 is surrounded by the low voltage region 210. The junction termination region 250 is disposed between the low voltage region 210 and the high voltage region 230. The high voltage region 230 is formed in an island shape. A high voltage LDMOS transistor 240 and a high voltage junction capacitor 260 are partially disposed within the junction termination region 250. More specifically, a portion of the high voltage LDMOS transistor 240 is overlapped with the junction termination region 250, and the other portion thereof is surrounded by the junction termination region 250. Similarly, a portion of the high voltage junction capacitor 260 is overlapped with the junction termination region 250, and the other portion thereof is surrounded by the junction termination region 250. The high voltage LDMOS transistor 240 and the junction termination region 250 have the same cross sectional structure except electrical wiring lines. The details will be described later.

Referring to FIG. 3, the high voltage LDMOS transistor 240 comprises a $p^-$ type semiconductor substrate 201, an n type epitaxial layer 202, p type first diffusion regions 203 and 204, a n type second diffusion region 241, a $p^+$ type diffusion region 242, an $n^+$ type source/drain region 243, an $n^+$ type buried layer 205, a p type top region 244, a gate insulating film 245, a gate electrode 246, a source electrode 247, and a drain electrode 248. Each of the $p^+$ type first diffusion regions 203 and 204, which form insulating region 220, includes a p type buried layer 203 and a p type impurity region 204, which are vertically adjacent to each other. A first insulating region 220 is disposed inside the junction termination region 250 and a second insulating region 220 is disposed between the high voltage region 230 and the high voltage LDMOS transistor 240 outside the junction termination region 250. The n type drift layer 202 of the low voltage region 210 (that is, a left-side n type drift layer 202) and the n type drift layer 202 of the high voltage LDMOS transistor 240 (that is, a right-side n type drift layer 202) are electrically isolated from each other by the p type first diffusion regions 203 and 204 that form the second insulating region. In addition, the junction termination region 250 further includes an intermediate region between the insulating region 220 and the high voltage region 230. The intermediate region has a width d3, as shown in FIGS. 2 and 3.

More specifically, the n type epitaxial layer 202 is formed on the p type semiconductor substrate 201. Between the n type epitaxial layer 202 and the p-type semiconductor substrate 201, the p type buried layers 203 and the $n^+$ type buried layer 205 are formed to be separated from each other. The n type second diffusion region 241 is formed on the p type impurity region 204. The n type second diffusion region 241, over which a channel is formed, is used as a well region. The $n^+$ type source region 243 and the $p^+$ type diffusion region 242 are formed on the surface of the n type second diffusion region 241. A first $n^+$ type drain region 254 is formed to be separated a certain distance from the $n^+$ type buried layer 205 and is disposed on the surface of the n type drift layer 202 over the $n^+$ type buried layer 205. The source electrode 247 is electrically contacted to the $p^+$ type diffusion region 242 and $n^+$ type source region 243. The drain electrode 248 is electrically contacted to the $n^+$ type drain region 254. The gate electrode 246 is formed on the channel region of the n type second diffusion region 241 through the gate insulating layer 245. The electrodes 246, 247, and 248 are insulated by an insulating layer 206.

In addition, the high voltage region 230 further includes an $n^+$ type buried layer 207 disposed between the $p^-$ type semiconductor substrate 201 and the n type drift layer 202. A second $n^+$ region 256 is disposed in an upper portion of the high voltage region 230. The impurity region 256 is contacted to a metal electrode which is integral with or directly connected to the drain electrode of the high voltage LDMOS transistor 240.

In addition, a distance d1 or d2 between the p type buried layer 203 and the $n^+$ type buried layer 205 or 207 outside the junction termination region 250 is a half or less of the distance d3 between the p type buried layer 203 and the $n^+$ type buried layer 205 inside junction termination region 250.

Referring to FIG. 4, the high voltage junction capacitor 260 is formed between the low voltage region 210 and the junction termination region 250. A portion of the high voltage junction capacitor 260 is overlapped with the junction termination region 250 adjacent to the low voltage region 210. The high voltage junction capacitor 260 comprises a p⁻ type semiconductor substrate 201, an n type epitaxial layer 202, p type first diffusion regions 203 and 204, a p type second diffusion region 251, a p⁺ type diffusion region 252, an n⁺ type drain region 263, an n⁺ type buried layer 205, a p type top region 264, a gate insulating layer 265, a gate electrode 266, a source electrode 267, and a drain electrode 268. Each of the p⁺ type first diffusion regions 203 and 204, which form an insulating region 220, includes a p type buried layer 203 and a p type impurity region 204, which are vertically adjacent to each other. A first insulating region 220 is disposed inside the junction termination region 250 and a second insulating region 220 is disposed between the high voltage region 230 and the high voltage junction capacitor 260 outside the junction termination region 250.

More specifically, the n type epitaxial layer 202 is formed on the p⁻ type semiconductor substrate 201. Between the n type epitaxial layer 202 and the p⁻ type semiconductor substrate 201, the p type buried layers 203 and the n⁺ type buried layer 205 are formed to be separated from each other. The p type second diffusion region 251 is formed on the p type impurity region 204. The p⁺ type diffusion region 252 is formed on the surface of the p type second diffusion region 251. In comparison with the high voltage LDMOS transistor 240 of FIG. 3, it can be understood that there is no n⁺ type source region. The n⁺ type drain region 263 is formed to be separated from the n⁺ type buried layer 205 on the surface of the n type drift layer 202 and generally over the n⁺ type buried layer 205. The source electrode 267 is electrically contacted to the p⁺ type diffusion region 252. The drain electrode 268 is electrically contacted to the n⁺ type drain region 263. The gate electrode 266 is formed on the channel region of the p type second diffusion region 251 through the gate insulating layer 265. The electrodes 266, 267, and 268 are insulated by an insulating layer 206.

In order to form the high voltage junction capacitor 260 in this structure, the source electrode 267 and the gate electrode 266 must constitute a short circuit. That is, as shown in FIG. 4, the source terminal S and the G are electrically connected to each other. In this case, a pn junction is generated at the boundary indicated by a bold solid line in FIG. 4. As a result of generation of the pn junction, the high voltage junction capacitor 260 is formed. On the other hand, the gate electrode 266 constituting a short circuit with the source electrode 267 serves as a field plate.

Since the junction termination region 250 and the high voltage region 230 in the high voltage junction capacitor 260 of FIG. 4 is the same as those in the high voltage LDMOS transistor 240 of FIG. 3, detailed description about the junction termination region 250 and the high voltage region 230 is omitted. Similarly, in the high voltage junction capacitor 260, a distance d1 or d2 between the p type buried layer 203 and the n⁺ type buried layer 205 or 207 outside the junction termination region 250 is a half or less of the distance d3 between the p type buried layer 203 and the n⁺ type buried layer 205 inside junction termination region 250.

Figure 5:
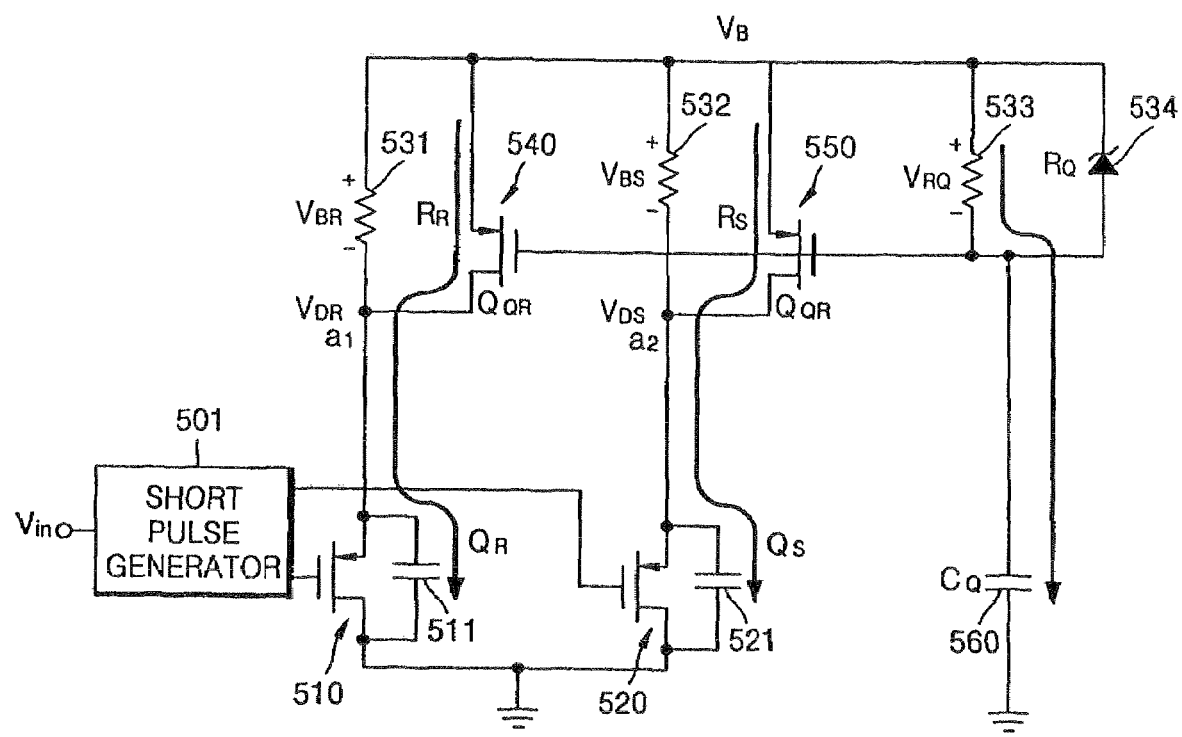
FIG. 5 is a circuit diagram showing one embodiment of a level shifting circuit constructed including the high voltage gate driver integrated circuit of FIG. 2.

FIG. 5 is a circuit diagram showing a level shifting circuit constructed by using a high voltage gate driver integrated circuit according to the present invention A short pulse generator 501 has one input terminal, to which a low signal Vin is input, and two output terminals. A first output terminal is connected to a gate terminal of a first level shift transistor 510. A second output terminal is connected to a gate terminal of a second level shift transistor 520. A first parasitic capacitor 511 is formed between the source and drain of the first level shift transistor 510. The first parasitic capacitor 511 is not an independent element but a parasitic element in the structure of the first level shift transistor 510. Similarly, a second parasitic capacitor 521 is formed between the source and drain of the second level shift transistor 520. The second parasitic capacitor 521 is not an independent element but a parasitic element in the structure of the second level shift transistor 520.

The source terminals of the first level shift transistor 510 and the second level shift transistor 520 are grounded. The drain terminal of the first level shift transistor 510 is connected at first node a1 to one terminal of a first resistor 531 having a first resistance $R_R$. The other terminal of the first resistor 531 is connected to a bias line to which a high voltage $V_B$ is applied. First node a1 is between the first resistor 531 and the drain terminal of the first level shift transistor 510 is an output node/terminal. A node voltage $V_{DR}$ is output from the first node a1. Similarly, the drain terminal of the second level shift transistor 520 is connected at a second node a2 to one terminal of a second resistor 532 having a second resistance $R_S$. The other terminal of the second resistor 532 is connected to a bias line, to which the high voltage $V_B$ is applied. Second node a2 is between the second resistor 532 and the drain terminal of the second level shift transistor 520 and is an output node/terminal. A node voltage $V_{DS}$ is output from the second node a2.

A first by-pass transistor 540 is disposed between the high voltage bias line and the first node a1. The first by-pass transistor 540, which is a p type MOS transistor, has a drain terminal connected to the high voltage bias line and a source terminal connected to the first node a1. A second by-pass transistor 550 is disposed between the high voltage bias line and the second node a2. The second by-pass transistor 550, which is also a p type MOS transistor, has a drain terminal connected to the high voltage bias line and a source terminal connected to the second node a2. The gate terminals of the first by-pass transistor 540 and the second by-pass transistor 550 are connected to the same gate line. A third resistor 533 having a third resistance $R_Q$ and a zener diode 534 are disposed in parallel to each other between the gate line and the high voltage bias line.

On the other hand, the gate line is connected to one terminal of a high voltage junction capacitor 560 having a certain capacitance $C_Q$. The other terminal of the high voltage junction capacitor 560 is grounded. Here, the high voltage junction capacitor 560 is the high voltage junction capacitor of FIG. 4.

In a level shift circuit having the above-described structure, the outputs are the first node voltage $V_{DR}$ at the first node a1 and the second node voltage $V_{DS}$ of the second node a2. The first node voltage $V_{DR}$ corresponds to a difference between the high voltage $V_B$ applied from the high voltage bias line and a voltage drop $V_{BR}$ of the first resistor 531. The second node voltage $V_{DS}$ corresponds to a difference between the high voltage $V_B$ applied from the high voltage bias line and a voltage drop $V_{BR}$ of the second resistor 532.

In a case where there are not provided the first by-pass transistor 540, the second by-pass transistor 550, the second resistor 532, and the high voltage junction capacitor 560, when the first level shift transistor 510 and the second level shift transistor 520 are turned off, no current flows between the high voltage bias line and a ground line. Therefore, no voltage drop can occur at the first resistor 531 and the second resistor 532. However, since the first parasitic capacitor 511 and the second parasitic capacitor 521 exist, a current resulting from charge of the first parasitic capacitor 511 and the second parasitic capacitor 521 flows the first resistor 531 and the second resistor 532. As a result, an undesirable level of voltages would otherwise be present at the output terminals (i.e., the first node a1 and second node a2).

On the contrary, however, in a case where there are provided the first by-pass transistor 540, the second by-pass transistor 550, the third resistor 533, and the high voltage junction capacitor 560, the aforementioned problem does not occur. More specifically, when the first level shift transistor 510 and the second level shift transistor 520 are turned off, a current flows from the high voltage bias line though the third resistor 533 to charge the high voltage junction capacitor 560. Due to the current, a certain level $V_{RQ}$ of voltage drop is generated at the third resistor 533. Therefore, the first by-pass transistor 540 and the second by-pass transistor 550 are turned on. If the first by-pass transistor 540 and the second by-pass transistor 550 are turned on, the current from the high voltage bias line does not flow through the first resistor 531 and the second resistor 532, but rather flows through the first by-pass transistor 540 and the second by-pass transistor 550. As a result, the levels of the voltages do not change at the output terminals: the first node a1; and second node a2.

According to a high voltage gate driver integrated circuit including a high voltage junction capacitor and a high voltage LDMOS transistor of the present invention, since the high voltage LDMOS transistor for level-shifting and the high voltage junction capacitor for forming a by-pass circuit are overlapped with a junction termination region of the high voltage gate driver integrated circuit, it is possible to implement a smaller cell area than a high voltage gate driver integrated circuit requiring an additional junction capacitor outside thereof. In addition, since the high voltage junction capacitor can be constructed by modifying the structure of the high voltage LDMOS transistor, it is possible to easily manufacture the high voltage gate driver integrated circuit.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A high voltage gate driver integrated circuit comprising:
   a high voltage region;
   a junction termination region surrounding the high voltage region;
   a low voltage region surrounding the junction termination region; and
   a level shift transistor disposed between the high voltage region and the low voltage region, at least some portions of the level shift transistor being overlapped with the junction termination region;
   wherein the level shift transistor is a LDMOS transistor and comprises:
      a second conductive type epitaxial layer formed on a first conductive type substrate;
      a first conductive type well region formed over the epitaxial layer;
      a second conductive type highly doped source region formed over the well region;
      a second conductive type highly doped drain region formed over the epitaxial layer to be separated from the well region in a lateral direction;
      a gate electrode formed on a channel formation region over the well region through a gate insulating layer;
      a source electrode electrically connected to the highly doped source region; and
      a drain electrode electrically connected to the highly doped drain region.

2. The high voltage gate driver integrated circuit according to claim 1, wherein the junction termination region comprises:
   a first region separated from the high voltage region, the first region surrounding the high voltage region; and
   a second region disposed between the first region and the high voltage region.

3. The high voltage gate driver integrated circuit according to claim 2, wherein the first region comprises an insulating region electrically isolating the LDMOS transistor from the low voltage region, and wherein the insulating region is contacted to a lower portion of the well region and extends in a vertical direction to the substrate.

4. The high voltage gate driver integrated circuit according to claim 1, further comprising a first conductive type highly doped contact region formed over the well region to be contacted to the source electrode.

5. The high voltage gate driver integrated circuit according to claim 4, wherein the junction termination region comprises:
   a first region separated from the high voltage region, the first region surrounding the high voltage region; and
   a second region disposed between the first region and the high voltage region.

6. The high voltage gate driver integrated circuit according to claim 5, wherein the first region comprises an insulating region electrically isolating the LDMOS transistor from the low voltage region, and wherein the insulating region is contacted to a lower portion of the well region and extends in a vertical direction to the substrate.

* * * * *